US011168392B2

(12) United States Patent
Karner et al.

(10) Patent No.: US 11,168,392 B2
(45) Date of Patent: Nov. 9, 2021

(54) WEAR AND/OR FRICTION REDUCTION BY USING MOLYBDENUM NITRIDE BASED COATINGS

(71) Applicant: Oerlikon Surface Solutions AG, Pfäffikon, Pfäffikon (CH)

(72) Inventors: Johann Karner, Triesen (LI); Volker Derflinger, Feldkirch (AT); Maximilian Erich Luichti, Chemnitz (DE)

(73) Assignee: OERLIKON SURFACE SOLUTIONS AG, PFÄHHIKON, Pfäffikon (CH)

( * ) Notice: Subject to any disclaimer, the term of this patent is extended or adjusted under 35 U.S.C. 154(b) by 522 days.

(21) Appl. No.: 15/575,031

(22) PCT Filed: May 25, 2016

(86) PCT No.: PCT/EP2016/000863
§ 371 (c)(1),
(2) Date: Nov. 17, 2017

(87) PCT Pub. No.: WO2016/188632
PCT Pub. Date: Dec. 1, 2016

(65) Prior Publication Data
US 2018/0135164 A1     May 17, 2018

(30) Foreign Application Priority Data

May 26, 2015 (DE) ..................... 10 2015 006 510.6
Apr. 7, 2016 (DE) ..................... 10 2016 003 998.1

(51) Int. Cl.
*B32B 9/00* (2006.01)
*C23C 14/00* (2006.01)
(Continued)

(52) U.S. Cl.
CPC ........ *C23C 14/325* (2013.01); *C23C 14/0021* (2013.01); *C23C 14/0641* (2013.01);
(Continued)

(58) Field of Classification Search
CPC ...... B32B 2250/42; F16J 9/26; C23C 28/044; C23C 28/42; C23C 28/042; C23C 30/005; C23C 14/0641; Y10T 428/24975
See application file for complete search history.

(56) References Cited

U.S. PATENT DOCUMENTS

2015/0275120 A1 * 10/2015 Lehnert ................. C23C 28/322
508/129

FOREIGN PATENT DOCUMENTS

DE        10 2012 207 814 A1   11/2013
DE           102012207814 A1 * 11/2013  ........... C23C 14/027
(Continued)

OTHER PUBLICATIONS

Kazmanli, et al., "Effect of Nitrogen Pressure, Bias Voltage and Substrate Temperature on the Phase Structure of Mo'N Coatings Produced by Cathodic Arc PVD", Surface and Coatings Technology, Elsevier, Amsterdam, NL, vol. 167, No. 1, Apr. 1, 2013, pp. 77-82.
(Continued)

*Primary Examiner* — Laura A Auer
(74) *Attorney, Agent, or Firm* — Pearne & Gordon LLP

(57) ABSTRACT

A component including a substrate surface coated with a coating including at least one MoN layer having a thickness not less than 40 nm. Between the substrate surface and the at least one MoN layer the component includes: i) a substrate surface hardened layer, which is a hardened, nitrogen-containing substrate surface layer that is the result of a nitriding treatment carried out at the substrate surface and has a thickness not less than 10 nm, preferably not less than 20 nm and not greater than 150 nm, and/or ii) a layer system composed of more than 2 MoN layers and more than 2 CrN layers, wherein the MoN and CrN layers forming the layer system are individual layers deposited alternatingly one on each other forming a multilayer MoN/CrN coating film.

16 Claims, 3 Drawing Sheets

(51) Int. Cl.
    *C23C 14/06*    (2006.01)
    *C23C 14/32*    (2006.01)
    *C23C 28/04*    (2006.01)
    *C23C 28/00*    (2006.01)
    *C23C 30/00*    (2006.01)
    *F16J 9/26*     (2006.01)

(52) U.S. Cl.
    CPC .......... *C23C 28/042* (2013.01); *C23C 28/044* (2013.01); *C23C 28/42* (2013.01); *C23C 30/005* (2013.01); *F16J 9/26* (2013.01); *Y10T 428/24975* (2015.01)

(56) References Cited

FOREIGN PATENT DOCUMENTS

DE   10 2012 020 757 A1   5/2014
WO       2005/121609 A1  12/2005
WO       2014/063676 A1   5/2014

OTHER PUBLICATIONS

International Search Report for PCT/EP2016/000863 dated Oct. 10, 2016.
Written Opinion for PCT/EP2016/000863 dated Oct. 10, 2016.

\* cited by examiner

WEAR AND/OR FRICTION REDUCTION BY USING MOLYBDENUM NITRIDE BASED COATINGS

The present invention relates to coatings for attaining reduction of wear or reduction of friction on surfaces of components. Such components for example can be used in the automotive sector or precision components (i.e. highly engineered components) sector. In this regard the components can be for example piston pins, cam followers or piston rings or nozzle needles.

The use of molybdenum coatings or molybdenum comprising coatings is well known. The use of molybdenum nitride as wear reduction coating on surfaces of components is in particular well known.

The behavior of the interface between the substrate surface of the component and the molybdenum nitride coating is however still today unsatisfactory and insufficient for meeting the current industrial requirements during application of the so coated components.

This has been especially observed when the substrate material to be coated is not hard enough, it means in this context that the substrate material has a hardness for example between 50-65 HRC, in any case not higher than 65 HRC.

FIG. 1 shows a picture of a coated surface after Rockwell indentation HRC, where the hardness of the substrate is between 50 and 65 HRC and the substrate is coated with MoN. Ring-shaped fracture of the MoN coating can be clearly observed surrounding the HRC Rockwell indentation.

It is possible that the observed ring-shaped fracture has been produced as a consequence of the big difference between the hardness and Young's modulus of the MoN coating and the hardness and Young's modulus of the substrate material. It is supposable, because actually the hardness and Young's modulus in the molybdenum nitride coating are considerable higher in comparison with the substrate, and consequently it is possible that the substrate has been considerably deformed during the application of the indentation load, while the MoN coating has been less deformed and therefore the MoN coating cracked.

For this reason this can be in particular a big problem when variable loads (interrupted load) are applied on the coated substrate of the component.

Essentially this problem can be avoided by using substrates having a higher hardness, such as e.g. substrates made of cemented carbide. However the components used in many automotive applications are made of materials which have Rockwell hardness lower than 65 HRC.

The objective of the present invention is to modify the molybdenum nitride coating and/or the substrate surface to be coated in order to improve the contact between substrate surface and MoN coating when the substrate exhibit a hardness of 65 HRC or lower and the coated substrate is subjected to load or especially to interrupted load.

In particular it is intended that the inventive solution makes possible that no ring-shaped fracture lines are produced during Rockwell indentation by conduction of HRC Rockwell tests in substrates coated with MoN based coatings when the substrate hardness is lower or equal to 65 HRC.

The objective of the present invention is attained by providing a component having a layer or a layer system between the substrate surface and the coating comprising at least one MoN layer according to the claims.

DETAILED DESCRIPTION

The inventors found that surprisingly it is possible to avoid ring-shaped fractures lines by subjecting the substrate to be coated with the MoN coating to a nitriding process, wherein the substrate surface hardness is increased before depositing the MoN coating. Afterwards the MoN coating is applied on the component surface which was previously hardened by nitriding as mentioned above.

The MoN coatings in the context of the present invention were deposited by using a reactive PVD process.

In particular, reactive arc PVD process are demonstrated to be suitable for depositing MoN coatings on component surfaces hardened as suggested above.

It is a special advantage of the used method that the nitriding process of the substrate and the coating process can be done in a same vacuum chamber of a coating machine.

In this manner it was a good adhesion between the nitriding layer and the coating without formation of a white layer was guaranteed.

The MoN coating can be deposited exhibiting a hexagonal phase or a cubic phase or a mixture of hexagonal and cubic phases.

Figure 1:
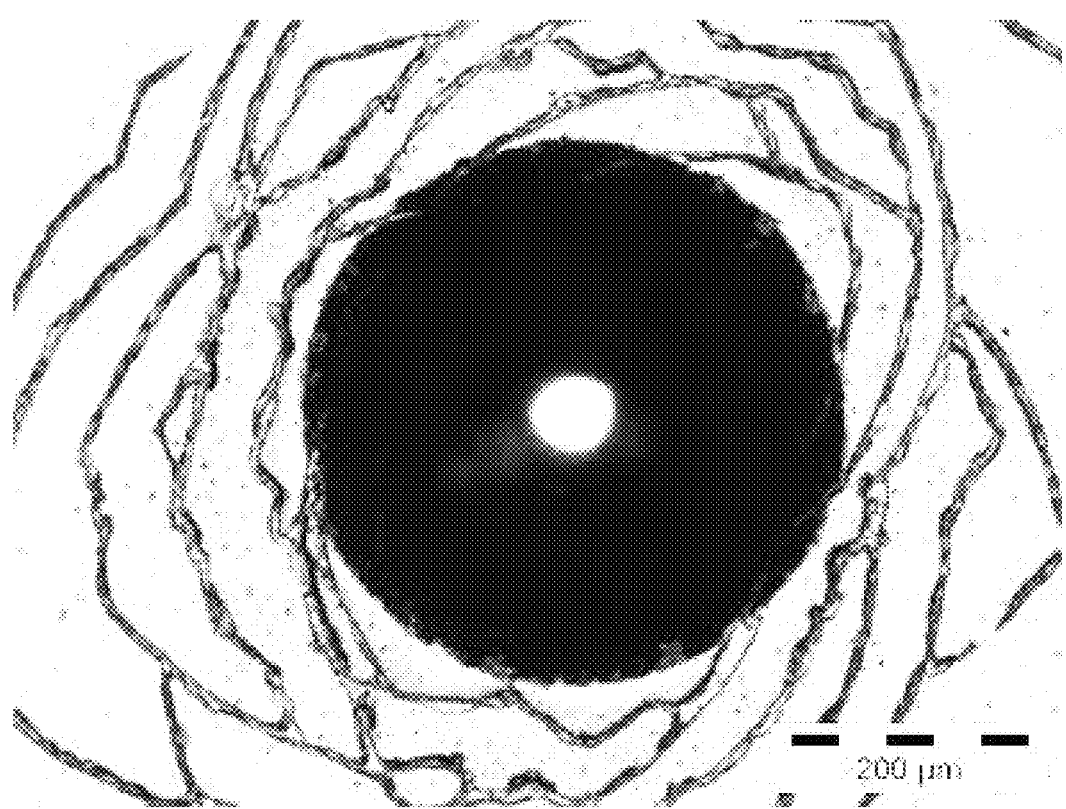
FIG. 1 shows a coated surface after Rockwell indentation.
Figure 2:
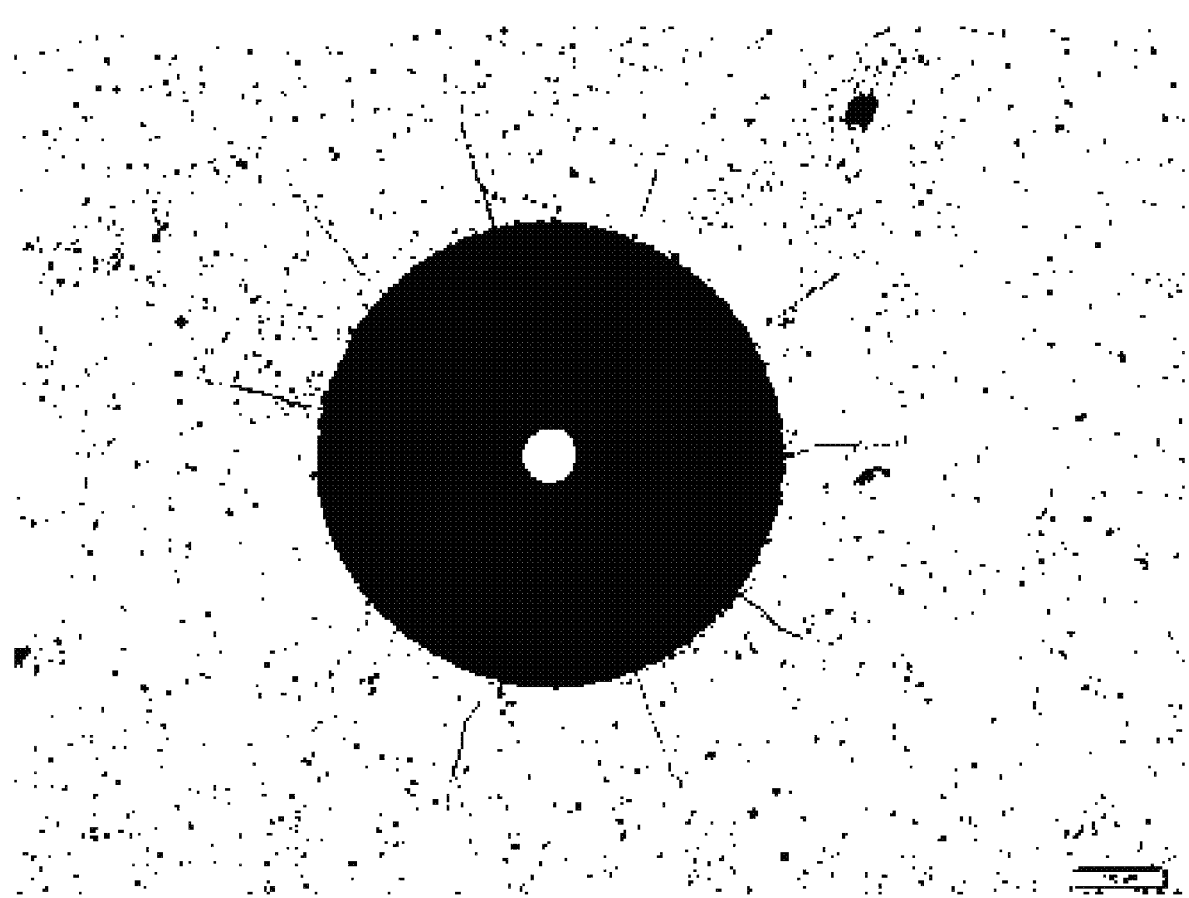
FIG. 2 shows a surface according the described solution.

FIG. 2 shows a picture of a surface coated according to the above mentioned inventive solution that was tested afterwards according to the standard HRC Rockwell test. In this picture it is clear to see that no ring-shaped fracture lines surrounding the Rockwell indentation can be observed.

The inventors found also surprisingly that it is possible to avoid ring-shaped fractures lines by subjecting coating the substrate surface of the component with a modified MoN coating. In this case it was not necessary to modify previously the component surface to be coated, that means that no previous nitriding step is needed.

Concretely, the inventors proposes to apply a multilayer structured MoN/CrN coating, which comprises alternate deposited individual layers of MoN and individual layers of CrN. Especially good results i.e. Rockwell indentations without ring-shaped fracture lines or further adhesive failures were in particular observed by using this second inventive solution when the thickness of the multilayer coating was about 4 to 5 µm.

In this case the MoN layers can be also deposited exhibiting a hexagonal phase or a cubic phase or a mixture of hexagonal and cubic phases.

As mentioned above, using this second inventive solution thicknesses of the multilayer structured MoN/CrN coating of about 4 to 5 µm were required for obtaining pictures after HRC Rockwell test, which show no ring-shaped fracture lines and also no signs of further adhesive failures. However, it might be that such kind of MoN/CrN multilayer coatings but having a thickness less than 4 µm are suitable for a specific application because the load in a real application might be not as high as in the HRC Rockwell test. In this case a thickness of for example 2 µm might be enough for a MoN/CrN multilayer coating applied on components used in real automotive applications.

The MoN and CrN individual layers can be deposited for example by using a reactive PVD process. According to a preferred embodiment of the present second inventive solution, a reactive arc PVD process is used for depositing the MoN and the CrN individual layers of the multilayer coating.

Since as described in the first inventive solution the component surface to be coated with a MoN coating must be previously nitrided and standard nitriding processes are conducted at temperatures of 450° C. or higher, only components made of materials which can resist such temperatures can be treated in this manner.

In this regard, the second inventive solution (using a MoN/CrN multilayer coating) involves the advantage that the coating process can be conducted at temperatures lower than 450° C., e.g. of 200° C. Since as already mentioned no nitriding step is necessary, components made of temperature sensitive materials can be treated, like for example piston pins.

It was observed that in some cases a further improved contact in the context of the present invention was attained by providing an adhesion layer made of CrN. This adhesion layer was deposited for example before depositing the MoN coating according to the first inventive solution or before depositing the modified MoN coating according to the second inventive solution, respectively. The CrN adhesion layer is preferably provided having a layer thickness of at least 30 nm. The thickness of the CrN adhesion layer preferably between 0.05 µm and 1 µm.

In particular components of the type piston pins, cam followers, piston rings and nozzle needles were treated with the first and second inventive solutions in the context of the experiments concerning the present invention.

It was in particular very surprisingly that cam follower treated according to the first inventive solution did not show any damage after the nitriding step. The components that can be treated according to the present invention are however not limited by this description.

The surfaces of the components treated according to the present invention (according to the first as well as the second inventive solution) exhibit additionally very good tribological properties, in particular concerning increment of wear resistance.

EXAMPLES

Different automotive and precision components were treated according to the present invention and stupendous improvements concerning increment of wear resistance were attained.

Following the present invention will be explained in more detail using the example of cam followers. Some cam followers were treated according to the state of the art and others were treated according to some preferred embodiments of the present invention. Subsequently, all treated cam followers were subjected to different analysis and tests.

A qualified reference sample made of 1.2842 19MnCrV8 with hardness 64 HRC before coating (following referred to as QRS) test piece having a steel surface and at least one cam follower was subjected to the following treatments:

Treatment A (state of the art): The surfaces of the QRS and the cam followers to be tested were coated with a MoN layer having a thickness of approximately 2.5 µm on QRS and 4.5 µm on cam follower. Between the MoN layer and the surface of the cam follower a thin CrN layer with thickness of approximately 50 nm was deposited as adhesion layer. The MoN layer was deposited by using reactive Arc PVD techniques. By deposition of the MoN layer a Mo target was arc vaporized in a vacuum atmosphere comprising nitrogen as reactive gas. The nitrogen partial pressure was maintained at 3 Pa and the substrate temperature (i.e. the temperature of surface of the cam follower being treated) was approximately 200° C. The MoN layer was formed comprising basically only the hexagonal phase of molybdenum nitride.

Treatment B (inventive): The surfaces of the QRS and the cam followers to be tested were coated with the same coating as described in Treatment A, but the cam follower surface was previously subjected to a hardening step consisting of a plasma nitriding process carried out in a vacuum chamber comprising nitrogen. The substrate temperature (the temperature of the component measured at the surface being subjected to treatment) was approximately 480° C. In this manner a hardened, nitrogen-containing surface layer having a thickness of approximately 50 µm was formed. Subsequently a MoN layer was deposited by using reactive Arc PVD techniques. By deposition of the MoN layer a Mo target was arc vaporized in a vacuum atmosphere comprising nitrogen as reactive gas. The nitrogen partial pressure was maintained at 3 Pa and the substrate temperature (i.e. the temperature of surface of the cam follower being treated) was approximately 480° C. The MoN layer was formed comprising a mixture of hexagonal phase and at least one cubic phase of molybdenum nitride. For some of the experiments a thin CrN layer with thickness of approximately 50 nm was deposited as adhesion layer between the MoN layer and the hardened, nitrogen-comprising surface layer.

Treatment C (inventive): The surfaces of the QRS and the cam followers to be tested were treated similarly as described in Treatment B, but after the hardening step, the coating chamber was cooled down until the substrates to be coated attained a temperature of approximately 200° C. and the MoN layer was then deposited by using a nitrogen partial pressure of 3 Pa but at a substrate temperature of approximately 200° C. In this manner the MoN layer was formed comprising basically only the hexagonal phase of molybdenum nitride. The thickness of the hardened, nitrogen-containing surface layer was approximately 50 µm. The thickness of the MoN layer was about 2.5 µm on QRS and 4.5 µm on cam follower. For some of the experiments a thin CrN layer with thickness of approximately 50 nm was deposited as adhesion layer between the MoN layer and the hardened, nitrogen-comprising surface layer.

Figure 3:
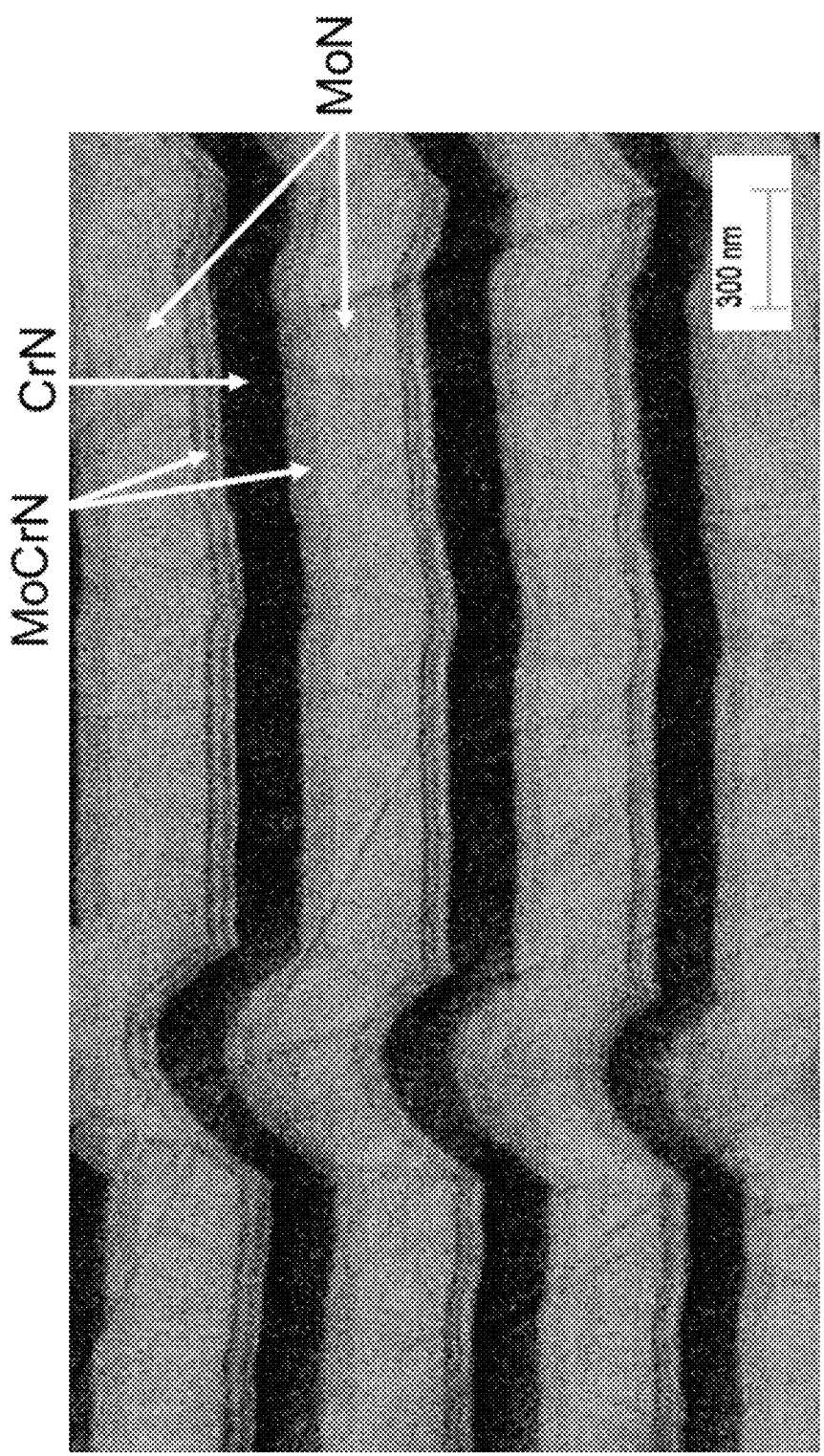
FIG. 3 shows a cross section of a portion of a multilayer MoN/CrN coating film on a cam follower.

Treatment D (inventive): The surfaces of the QRS and the cam followers to be tested were coated with a multilayer MoN/CrN coating film having a thickness of approximately 4 µm on both QRS and cam follower. The multilayer MoN/CrN coating film was deposited by using reactive Arc PVD techniques. By deposition of the multilayer MoN/CrN coating film one Mo target and one Cr targets were arc vaporized in a vacuum atmosphere comprising nitrogen as reactive gas. The nitrogen partial pressure was maintained at 3 Pa and the substrate temperature was approximately 200° C. MoN individual layers and CrN individual layers were deposited alternate one on each other as shown in FIG. 3. For some experiments a thin CrN layer with thickness of approximately 50 nm was deposited as adhesion layer between the multilayer MoN/CrN coating film and the surface to be coated. In this case the QRS and cam follower surface was not modified by subjecting it to any hardening step as described in the Treatments B and C.

FIG. 3 shows a picture of a cross section corresponding to a portion of a multilayer MoN/CrN coating film deposited on a cam follower according to the present invention.

During deposition of the multilayer the MoN individual layers only the Mo target was arc-vaporized, likewise during deposition of the CrN individual layers only the Cr target was arc-vaporized. Between the MoN individual layer and the CrN individual layers, intermediate layers were deposited. During deposition of the intermediate layers both Mo target and Cr target were simultaneously arc-vaporized. In this manner intermediate layers of MoCrN (i.e. intermediate layers comprising Cr, Mo and N) were formed.

The individual MoN layers comprised in the multilayer MoN/CrN coating film deposited in this manner comprised a mixture of hexagonal phase and at least one cubic phase of molybdenum nitride.

The treated QRS were tested by using the HRC Rockwell test and the cam followers were tested by using an engine valve test at different rotation speeds during up to 200 hours.

The inventors observed that the all surfaces of the cam followers treated with the Treatments A according to the state of the art presented strong wear after the discontinuous mechanical load test and actually in all cases the coating was after 2 hours completely removed and the cam followers themselves showed deep wear grooves.

Contrariwise, all surfaces of the cam followers treated with the Treatments B, C and D according to the present invention presented surprisingly practically no wear after 200 hours in the engine test. The highest wear observed in these cases was of 0.35 μm. This means that in the worst case only 0.35 μm from the overall coating thickness was removed.

The treated surfaces of the QRS were tested by using In HRC Rockwell test as mentioned above. All surfaces of the QRS treated with the Treatments A according to the state of the art presented ring-shaped fractures after HRC Rockwell test. Contrariwise, all surfaces of the QRS treated with the Treatments B, C and D according to the present invention presented surprisingly no ring-shaped fractures after HRC Rockwell test.

Concretely the present invention relates to:
a component comprising a substrate surface coated with a coating comprising at least one MoN layer having a thickness not less than 40 nm, wherein between the substrate surface and the at least one MoN layer a substrate surface hardened layer is comprised, which is a hardened, nitrogen-containing substrate surface layer that is the result of a nitriding treatment carried out at the substrate surface and has a thickness not less than 10 μm, preferably not less than 20 μm and not greater than 150 μm,
or
a component comprising a substrate surface coated with a coating comprising at least one MoN layer having a thickness not less than 40 nm, wherein between the substrate surface and the at least one MoN layer:
a substrate surface hardened layer is comprised, which is a hardened, nitrogen-containing substrate surface layer that is the result of a nitriding treatment carried out at the substrate surface and has a thickness not less than 10 μm, preferably not less than 20 μm and not greater than 150 μm,
and
a layer system composed of more than 2 MoN layers and more than 2 CrN layers is comprised, wherein the MoN and CrN layers forming the layer system are individual layers deposited alternate one on each other forming a multilayer MoN/CrN coating film
or
a component comprising a substrate surface coated with a coating comprising at least one MoN layer having a thickness not less than 40 nm, wherein between the substrate surface and the at least one MoN layer a layer system composed of more than 2 MoN layers and more than 2 CrN layers is comprised, wherein the MoN and CrN layers forming the layer system are individual layers deposited alternate one on each other forming a multilayer MoN/CrN coating film.

According to a preferred embodiment of the present invention, if no multilayer MoN/CrN coating film is comprised between the substrate surface and the at least one MoN layer, said at least one MoN layer has a thickness not less than 500 nm. In such a case, the at least one MoN layer can be deposited in such a manner that it consists of molybdenum nitride comprising at least largely the hexagonal phase δ-MoN or only the hexagonal phase δ-MoN. However, if it is beneficial for the use of the component, it is also possible in such a case to deposit the at least one MoN layer consisting of molybdenum nitride, wherein it comprises a mixture of phases, the mixture comprising:
the hexagonal phase δ-MoN and the cubic phase γ-Mo$_2$N, or
the hexagonal phase δ-MoN and the oversaturated cubic phase ζ-MoN, or
the hexagonal phase δ-MoN and the cubic phase γ-Mo$_2$N and the oversaturated cubic phase ζ-MoN.

Preferably, the overall thickness of said at least one MoN layer is not less than 1 μm and not less than 15 μm, more preferably not less than 1.5 μm and not greater than 10 μm.

According to a further preferred embodiment of the present invention, if no hardened, nitrogen-containing substrate surface layer is comprised between the substrate surface and the at least one MoN layer, said multilayer MoN/CrN coating film has a thickness not less than 460 nm. In this case the above mentioned at least one MoN layer having a thickness not less than 40 nm can be also comprised between two multilayer MoN/CrN coating films, wherein each multilayer MoN/CrN coating film has preferably a film thickness not less than 460 nm.

Preferably the sum of the thicknesses of both multilayer MoN/CrN coating films and said at least one MoN layer is not less than 1 μm and not greater than 15 μm, preferably not less than 1.5 μm and not greater than 10 μm.

According to a further preferred embodiment of the present invention, at least between one individual MoN layer and one individual CrN layer an individual intermediate layer comprising Mo, Cr and N is comprised.

According to a further preferred embodiment of the present invention, the individual intermediate layer has a thickness not less than 10 nm and not greater than thickness of the individual CrN layer or the thickness of the individual MoN layer that is next to said individual intermediate layer.

According to a further present embodiment of the present invention, at least the majority of the individual MoN layers have an individual layer thickness not less than 40 nm and preferably not greater than 500 nm.

According to a further preferred embodiment of the present invention, at least the majority of the individual CrN layers have an individual layer thickness not less than 20 nm and preferably not greater than 500 nm.

According to a further preferred embodiment of the present invention, the overall thickness of said multilayer MoN/CrN coating film is not less than 1 µm and not greater than 15 µm, preferably not less than 1.5 µm and not greater than 10 µm.

According to further preferred embodiment of the present invention, the individual MoN layers consists of molybdenum nitride comprising a mixture of phases, the mixture comprising:
the hexagonal phase δ-MoN and the cubic phase γ-Mo$_2$N, or
the hexagonal phase δ-MoN and the oversaturated cubic phase ζ-MoN, or
the hexagonal phase δ-MoN and the cubic phase γ-Mo$_2$N and the oversaturated cubic phase ζ-MoN.

The treatments according to the present invention are particularly advantageously, when the component is an automotive component or a precision component, and more in particular if the substrate surface of the component has a hardness equal or lower than 65 HRC.

A preferred method for producing a component according to at least one of the embodiments of the present invention, comprises the deposition of said at least one MoN layer or of at least one of the individual MoN layers by means of a reactive PVD process.

Preferably the method involves the use of a reactive Arc PVD process as reactive PVD process, wherein during deposition of the MoN layer or the MoN individual layer, at least one target of Mo is operated as cathode and in this manner evaporated by using Arc PVD techniques in an atmosphere comprising nitrogen as reactive gas.

What is claimed is:

1. Component comprising a substrate surface coated with a coating comprising at least one MoN layer having a thickness not less than 40 nm, wherein
between the substrate surface and the at least one MoN layer:
a layer system composed of more than 2 MoN layers and more than 2 CrN layers is comprised, wherein the MoN and CrN layers forming the layer system are individual layers deposited alternate one on each other forming a multilayer MoN/CrN coating film,
wherein no hardened, nitrogen-containing substrate surface layer is comprised between the substrate surface and the at least one MoN layer, and wherein said multilayer MoN/CrN coating film has a thickness not less than 460 nm.

2. The component according to claim 1, wherein at least between one individual MoN layer and one individual CrN layer an individual intermediate layer comprising Mo, Cr and N is comprised.

3. The component according to claim 2, wherein the individual intermediate layer has a thickness not less than 10 nm and not greater than thickness of the individual CrN layer or the thickness of the individual MoN layer that is next to said individual intermediate layer.

4. The component according to claim 3, wherein at least the majority of the individual MoN layers have an individual layer thickness not less than 40 nm.

5. The component according to claim 3, wherein at least the majority of the individual CrN layers have an individual layer thickness not less than 20 nm.

6. The component according to claim 1, wherein on the surface of the at least one MoN layer having a thickness not less than 40 nm a second multilayer MoN/CrN coating film is deposited.

7. The component according to claim 1, wherein said at least one MoN layer consists of molybdenum nitride comprising at least largely the hexagonal phase δMoN or only the hexagonal phase δMoN.

8. The component according to claim 1, wherein the individual MoN layers consists of molybdenum nitride comprising a mixture of phases, the mixture comprising:
the hexagonal phase δ-MoN and the cubic phase γ-Mo$_2$N, or
the hexagonal phase δ-MoN and the oversaturated cubic phase ζ-MoN, or
the hexagonal phase δ-MoN and the cubic phase γ-Mo$_2$N and the oversaturated cubic phase ζ-MoN.

9. The component according to claim 1, wherein the component is an automotive component or a precision component.

10. Method for producing a component according to claim 1, wherein said at least one MoN layer or at least one of the individual MoN layers are deposited by means of a reactive PVD process.

11. The method according to claim 10 wherein the reactive PVD process is a reactive Arc PVD process, wherein during deposition of the MoN layer or the MoN individual layer, at least one target of Mo is operated as cathode and in this manner evaporated by using Arc PVD techniques in an atmosphere comprising nitrogen as reactive gas.

12. The component according to claim 4, wherein at least the majority of the individual MoN layers have an individual layer thickness not greater than 500 nm.

13. The component according to claim 5, wherein at least the majority of the individual CrN layers have an individual layer thickness not greater than 500 nm.

14. The component according to claim 6, wherein the sum of the thicknesses of both multilayer MoN/CrN coating films and said at least one MoN layer is not less than 1 µm and not greater than 15 µm.

15. The component according to claim 14, wherein the sum of the thicknesses of both multilayer MoN/CrN coating films and said at least one MoN layer is not less than 1.5 µm and not greater than 10 µm.

16. The component according to claim 9, wherein the substrate surface of the component has a hardness equal to or lower than 65 HRC.

* * * * *

UNITED STATES PATENT AND TRADEMARK OFFICE
CERTIFICATE OF CORRECTION

PATENT NO. : 11,168,392 B2
APPLICATION NO. : 15/575031
DATED : November 9, 2021
INVENTOR(S) : Karner et al.

It is certified that error appears in the above-identified patent and that said Letters Patent is hereby corrected as shown below:

On the Title Page

(73) Assignee: "OERLIKON SURFACE SOLUTIONS AG, PFÄHHIKON" should be
-- OERLIKON SURFACE SOLUTIONS AG, PFÄFFIKON --.

Signed and Sealed this
Seventh Day of June, 2022

Katherine Kelly Vidal
*Director of the United States Patent and Trademark Office*